(12) United States Patent
Preikszas

(10) Patent No.: US 8,129,693 B2
(45) Date of Patent: Mar. 6, 2012

(54) CHARGED PARTICLE BEAM COLUMN AND METHOD OF OPERATING SAME

(75) Inventor: Dirk Preikszas, Oberkochen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 275 days.

(21) Appl. No.: 12/492,783

(22) Filed: Jun. 26, 2009

(65) Prior Publication Data

US 2010/0327179 A1     Dec. 30, 2010

(51) Int. Cl.
*H01J 37/153* (2006.01)
(52) U.S. Cl. .................. 250/396 R; 250/310; 250/311; 250/307; 250/398
(58) Field of Classification Search .................. 250/310, 250/311, 307, 396 R, 396 ML, 398
See application file for complete search history.

(56) References Cited

U.S. PATENT DOCUMENTS

| | | | |
|---|---|---|---|
| 3,702,398 A | 11/1972 | Van-Essen et al. | |
| 3,801,784 A | 4/1974 | Wittry | |
| 3,802,784 A | 4/1974 | Reynolds et al. | |
| 5,319,207 A | 6/1994 | Rose et al. | |
| 6,855,939 B2 | 2/2005 | Rose et al. | |
| 7,223,983 B2 | 5/2007 | Kawasaki et al. | |
| 2003/0111613 A1 | 6/2003 | Rose | |
| 2004/0188635 A1 | 9/2004 | Kawasaki et al. | |

FOREIGN PATENT DOCUMENTS

| | | |
|---|---|---|
| DE | 2 102 616 A1 | 7/1971 |
| DE | 37 03 028 A1 | 9/1988 |
| DE | 198 60 224 A1 | 10/1999 |
| EP | 0 451 370 | 10/1991 |

OTHER PUBLICATIONS

H. Sawada et al., "Experimental evaluation of a spherical aberration-corrected TEM and STEM", Journal of Electron Microscopy vol. 54, No. 2, 2005, pp. 119-121.
D.C. Joy et al., "Electron channeling patterns in the scanning electron microscope", Journal of Applied Physics, vol. 53, No. 8, Aug. 1982, pp. 81-122.
L. Reimer, "Scanning Electron Microscopy", Chapter 9.2, Springer-Verlag, 1998, pp. 359-378.

*Primary Examiner* — Jack Berman
(74) *Attorney, Agent, or Firm* — Fish & Richardson P.C.

(57) ABSTRACT

A charged particle beam column includes a charged particle beam source to generate a charged particle beam; an objective lens to focus the charged particle beam in an object plane; a first condenser lens disposed in a beam path of the charged particle beam between the charged particle beam source and the objective lens; a deflector disposed in the beam path between the first condenser lens and the objective lens and configured to change an angle of incidence of the charged particle beam in an object plane; and an aberration corrector disposed in the beam path between the deflector and the objective lens and configured to compensate aberrations introduced by the objective lens. The aberration corrector is also configured to not compensate aberrations introduced by the first condenser lens.

18 Claims, 2 Drawing Sheets

CHARGED PARTICLE BEAM COLUMN AND METHOD OF OPERATING SAME

FIELD

The disclosure relates to a charged particle beam column and to a method of operating a charged particle beam column, including such columns and methods where an angle of incidence of a charged particle beam on a specimen can be varied.

BACKGROUND

A scanning electron microscope (SEM) is know which is configured such that an angle of incidence of a focused electron beam onto a specimen can be varied. Using such SEM, it is possible, for example, to obtain a first image by scanning the specimen with a focused electron beam while an angle of incidence of the beam on the specimen is set to a first value, and to obtain a second image by scanning the same specimen with the electron beam while the angle of incidence is set to a second value different from the first value. From analyzing the two images it is possible to reconstruct a three-dimensional structure of the specimen. The charged particle beam column can include an aberration corrector to compensate aberrations caused by condenser lenses and an objective lens of the charged particle beam column due to high tilted angles of the beam traversing the column including the condenser lenses and objective lens.

SUMMARY

The present disclosure provides a charged particle beam column and a method of operating a charged particle beam column, which can provide improved compensation of aberrations caused, for example, by highly tilted angles of a charged particle beam at a specimen.

In some embodiments, the disclosure provides a charged particle beam column that includes: a charged particle beam source configured to generate a charged particle beam; an objective lens configured to focus the charged particle beam in an object plane; a deflector disposed in a beam path of the charged particle beam between the charged particle beam source and the objective lens; and an aberration corrector configured to compensate aberrations introduced by components located in the beam path downstream of the deflector while avoiding compensation of aberrations introduced by components located in the beam path upstream of the deflector. The aberration corrector is disposed in the beam path between the deflector and the objective lens, which means that the charged particles traverse the aberration corrector on their way from the deflector to the objective lens.

In certain embodiments, the disclosure provides a charged particle beam column that include: an objective lens configured to focus a charged particle beam in an object plane; a first condenser lens disposed in a beam path of the charged particle beam upstream of the objective lens; a deflector disposed in the beam path between the first condenser lens and the objective lens, the deflector configured to change an angle of incidence of the charged particle beam in an object plane; and an aberration corrector disposed in the beam path between the deflector and the objective lens. The aberration corrector configured to compensate aberrations introduced by the objective lens, and the aberration corrector is configured to not compensate aberrations introduced by the first condenser lens.

In some embodiments, the disclosure provides a charged particle beam column that includes: an objective lens configured to focus a charged particle beam in an object plane; a deflector disposed in a beam path of the charged particle beam upstream of the objective lens; and an aberration corrector disposed in the beam path between the deflector and the objective lens. The aberration corrector is configured to compensate aberrations introduced by components located in the beam path downstream of the deflector without compensating aberrations introduced by components located in the beam path upstream of the deflector.

In certain embodiments, the disclosure provides a charged particle beam column that includes: a charged particle beam source configured to generate a charged particle beam; an objective lens configured to focus the charged particle beam in an object plane; a first condenser lens disposed in a beam path of the charged particle beam between the charged particle beam source and the objective lens; a deflector disposed in the beam path between the first condenser lens and the objective lens configured to change an angle of incidence of the charged particle beam in an object plane; and an aberration corrector disposed in the beam path between the deflector and the objective lens and configured to compensate aberrations introduced by the objective lens. The aberration corrector is also configured to not compensate aberrations introduced by the first condenser lens.

In some embodiments, a charged particle beam column can include a second condenser lens disposed in the beam path between the deflector and the objective lens. In such embodiments, the aberration corrector can be further configured to additionally correct aberrations introduced by the second condenser lens, which is located downstream of the deflector.

In certain embodiments, a charged particle beam column can include a beam scanner configured to scan a location of incidence of the charged particle beam across the object plane. Additionally or alternatively, a charged particle beam can include a particle detector configured to detect particles emerging from a specimen near the object plane.

In some embodiments, an aberration corrector can include a plurality of multipole lens elements. In certain embodiments, an aberration corrector can include a mirror configured to reflect the charged particle beam.

In some embodiments, the disclosure provides a method of operating a charged particle beam column that includes: condensing a charged particle beam while introducing first aberrations into the charged particle beam to provide a first condensed charged particle beam; deflecting the condensed charged particle beam to provide a deflected charged particle beam; focusing the deflected charged particle beam on a specimen while introducing second aberrations into the deflected charged particle beam; and compensating the second aberrations while leaving the first aberrations uncompensated to provide a compensated charged particle beam.

In certain embodiments, the disclosure provides a method of operating a charged particle beam column that includes: generating a charged particle beam; condensing the generated charged particle beam while introducing first aberrations on the beam; deflecting the condensed charged particle beam; and focusing the further condensed charged particle beam on a specimen while introducing second aberrations on the beam; and compensating the second aberrations while leaving the first aberrations uncompensated.

BRIEF DESCRIPTION OF THE DRAWINGS

The foregoing as well as other advantageous features of the disclosure will be more apparent from the following detailed description of exemplary embodiments, the drawings and the claims.

DETAILED DESCRIPTION OF EXEMPLARY EMBODIMENTS

Figure 1:
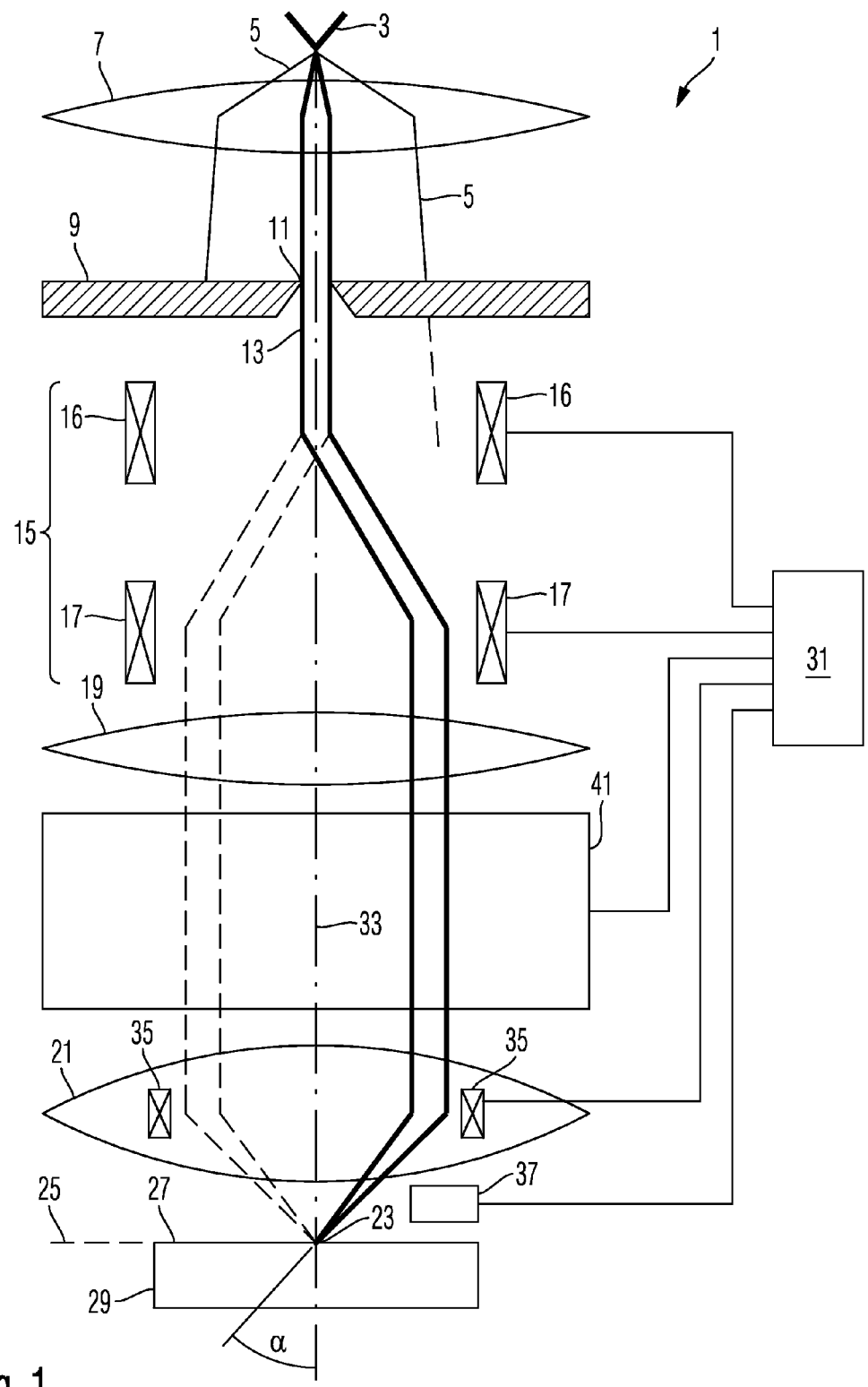
FIG. 1 is a schematic illustration of a charged particle beam column.

In the exemplary embodiments described below, components that are alike in function and structure are generally designated by like reference numerals.

FIG. 1 is a schematic illustration of a charged particle beam column 1. The charged particle beam column 1 shown in FIG. 1 has certain similarities with beam columns disclosed in more detail in U.S. Pat. No. 7,223,983 B2, the full disclosure of which is incorporated by reference herein.

The charged particle beam column 1 shown includes a charged particle beam source 3, which is an electron beam source in the illustrated embodiment. Other embodiments may include sources to generate beams of other charged particles, such as ions. A beam 5 of charged particles emitted from the source 3 traverses a condenser lens 7 to converge the beam 5 towards an aperture plate 9. The aperture plate 9 includes an aperture 11 having a diameter smaller than a diameter of a beam 5 incident on the aperture plate 9. The aperture plate 9 allows a relatively narrow collimated portion 13 of beam 5 to traverse the aperture 11 of the aperture plate 9.

Downstream of the aperture plate 9 in the beam path of the beam portion 13 there is disposed a deflection system 15 to deflect the beam 13. As shown in FIG. 1, the deflection system 15 includes two deflectors 16 and 17, which are disposed and configured to deflect the beam 13 at two locations spaced depart along the beam path. In certain embodiments, the deflection system may comprise a single deflector or three or more deflectors to deflect the beam at a single location or three or more locations along the beam path, respectively.

The charged particle beam column 1 also includes a condenser lens 19 disposed downstream of the deflection system 15 to further converge the beam towards an objective lens 21 which is configured to focus the beam 13 at a relatively small spot 23 on an object plane 25 at which a surface 27 of a specimen 29 can be arranged for inspection.

The charged particle beam column includes a controller 31 which is configured to energize the deflectors 16, 17 of the deflection system 15 such that an angle between a direction of the beam 13 at the object plane 25 relative to an axis 33 of symmetry of the objective lens 21 can be varied. FIG. 1 shows the beam 13 in full lines to be incident on the object plane 15 under the angle α in full lines wherein the deflectors 16 and 17 are energized according to a first pattern, and FIG. 1 shows the beam 13 in dotted lines to be incident under an opposite angle −α when the deflector 16 and 17 are energized by the controller 13 according to a second pattern.

The electron beam column 1 also include a deflection system to scan the location 23 at which the beam 13 is incident on the surface 27 of the specimen in directions transverse to the axis of symmetry 33. This deflection system includes a deflector 35 which can be mounted within the objective lens 21 or at any other suitable position along the beam path.

The charged particle beam column 1 further includes a secondary particle detector 37 which is configured to detect secondary particles emerging from the specimen 29 and which are released therefrom by the incident charged particles of the beam 13. These secondary particles can be, for example, secondary electrons. Detection signals generated by the detector 37 are received by the controller 31.

The charged particle beam column 1 can be operated as a scanning microscope to record an image of the specimen as follows: the controller 31 drives the deflector 35 such that the location 23 of incidence of a beam 13 on the specimen 29 is scanned across the surface 27, and detection signals generated by detector 37 are recorded for each scan position of location 23.

Further, multiple such images can be recorded for different angles α of incidence of the beam 13 on the specimen 29 by changing the energizing pattern of the deflection system 15. A three-dimensional structure of the specimen 29 can be obtained from an analysis of two or more images obtained at different angles α of incidence.

At higher angles α of incidence, the beam 13 traverses the condenser lens 19 and the objective lens at a distance from the axis 33 of symmetry, and the beam 13 does also traverse portions of the condenser lens 19 and objective lens 21 at beam directions which are tilted relative to the axis 33 of symmetry. This has a consequence that the condenser lens 19 and the objective lens 21 cause aberrations, such as chromatic aberrations and spherical aberrations, which distort the beam and can prevent a small focus diameter of the beam 13 at location 23. To compensate for such aberrations, the charged particle beam column 1 includes an aberration corrector 41 controlled by the controller 31. The aberration corrector 41 is schematically shown as a rectangle in FIG. 1. Such a corrector can include plural multipole lens elements, such as disclosed, for example, in U.S. Pat. No. 7,223,983 B2. Exemplary suitable correctors having plural multiple lens elements are disclosed in EP 0 451 370 A1, which is incorporated herein by reference in its entirety. Suitable aberration correctors may include a mirror configured to reflect the charged particle beam 13, such as disclosed, for example, in U.S. Pat. No. 5,319,207 A and U.S. Pat. No. 6,855,939 B2, each of which is incorporated herein by reference in its entirety.

The aberration corrector 41 is energized by the controller 31 such that aberrations introduced by the condenser lens 19 and the objective lens 21 are compensated for. To achieve the desired compensation, both the deflection system 15 and the aberration corrector 41 are properly adjusted. In some embodiments, this involves the following method: a specimen having a flat structured surface is mounted relative to the charged particle beam column 1 such that the surface of the specimen coincides with the object plane 25. The deflection system 15 is energized such that the charged particle beam is subsequently incident on the surface at multiple different tilt angles, and subsequently an image of the surface of the specimen is recorded as illustrated above for each setting of the tilt angle. Thereafter, an amount of displacement of the structures of the sample shown in the image relative to the structures in an image obtained at a tilt angle of α=0 is determined in dependence of the tilt angle α. If the deflection system 15 and the aberration corrector 41 are not correctly adjusted, the displacements will increase with increasing tilt angle α. Herein, the increase of displacement can be approximated by a sum of two components, where the first component increases linearly with the tilt angle and the second component increases with the third power of the tilt angle. The deflection system is adjusted by modifying the energization pattern for the deflectors 16 and 17 such that the first component which increases linearly with the tilt angle vanishes. Thereafter, the energization pattern applied to the aberration corrector 41 is varied such that the second component which increases with the third power of the tilt angle vanishes.

The aberration corrector 41 is energized such that aberrations introduced by components located downstream of the deflection system 15 are compensated. In FIG. 1, the components downstream of the deflection system 15 are the condenser lens 19 and the objective lens 21. A component upstream of the deflection system 15 is the condenser lens 7. Also the condenser lens 7 introduces aberration on the charged particle beam 13. However, these aberrations are not compensated by the aberration corrector. The fact that aberrations introduced by the condenser lens 7 are not compensated by the aberration corrector 41 adjusted as illustrated above can be shown as illustrated with reference to FIG. 2 below.

Figure 2:
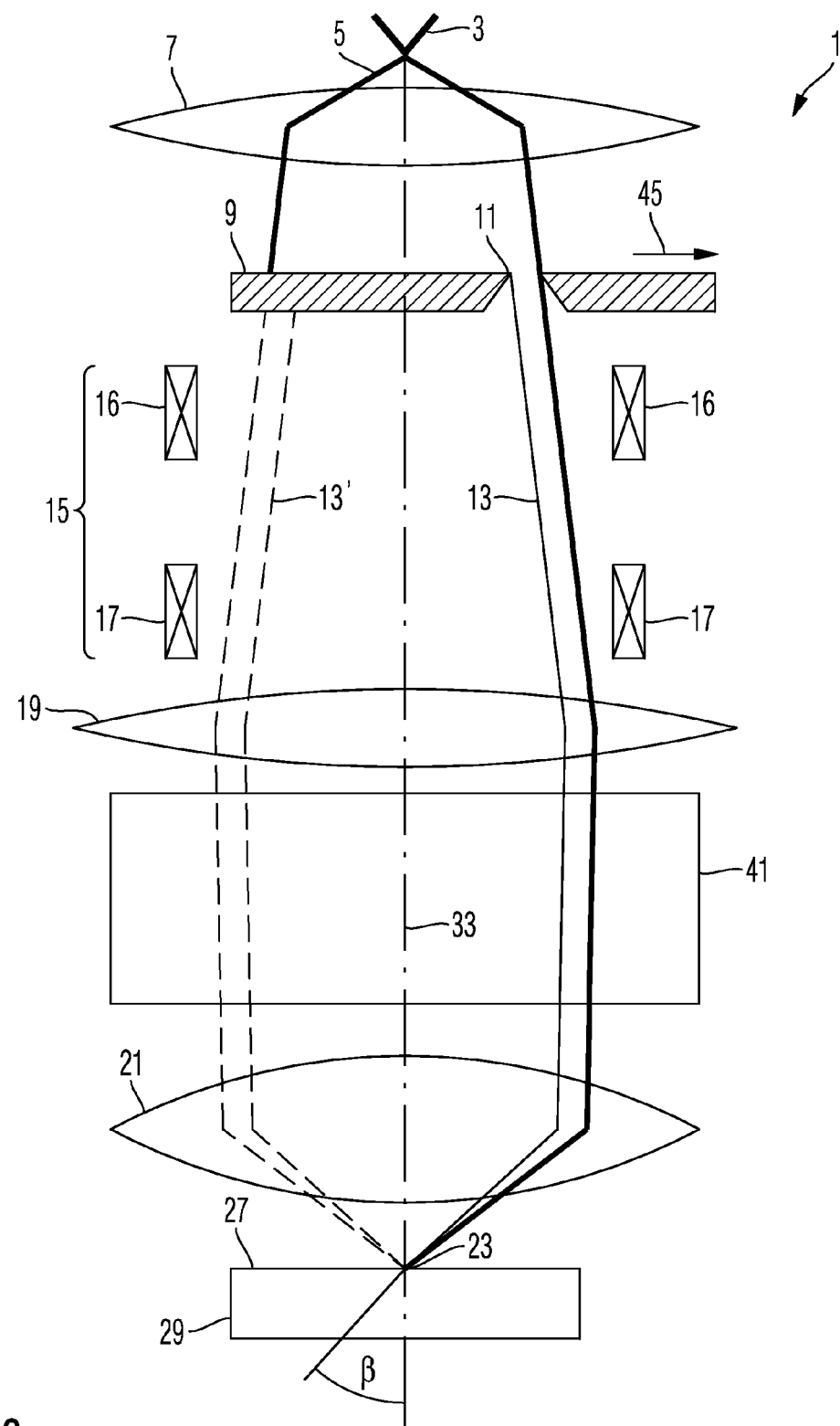
FIG. 2 is a schematic illustration of the charged particle beam column shown in FIG. 1 in a configuration to verify a setting for aberration compensation.

FIG. 2 shows the charged particle beam column 1 of FIG. 1 wherein the deflection system 15 is not energized such that the beam 13 is not deflected by on the deflection system 15. A tilt angle β of the beam 13 at the surface 27 of the specimen 29 is achieved by displacing the aperture plate 9 in a direction 45 such that the aperture 11 is located at a distance from the axis of symmetry 33. Due to the displacement of the aperture 11, the beam 13 traversing the aperture and shown in full lines in FIG. 2 will be incident on the sample at a tilt angle β. With this configuration of the aperture plate 9, a first image is recorded as illustrated above. Thereafter, the aperture plate 9 is displaced such that the aperture 11 is located on the other side of the axis 33 of symmetry such that a beam 13' shown in broken lines in FIG. 2 traverses the aperture plate 9 and is incident on the surface of the specimen under an angle −β which is opposite to the angle of incidence for the first image. With this configuration, a second image is recorded. If the aberration corrector is adjusted to compensate for aberrations introduced by the condenser lens 19 and the objective lens 21 while not compensating for aberrations introduced by the condenser lens 7, structures of the sample will be visible at different displaced locations in the two recorded images.

It is therefore possible to distinguish an aberration corrector adjusted as described herein from an aberration corrector adjusted such that it compensates aberrations introduced by the objective lens 21 and both condenser lenses 7 and 19. If the two images illustrated with reference to FIG. 2 were recorded with an aberration corrector that compensates aberrations for objective lens 21 and both condenser lenses 7 19, structures of specimen would be visible in both images at same locations.

While certain exemplary embodiments are disclosed herein, alternatives, modifications and variations will be apparent to those skilled in the art. Accordingly, the exemplary embodiments set forth herein are intended to be illustrative and not limiting in any way. Various changes may be made without departing from the spirit and scope of the present disclosure.

What is claimed is:

1. A system, comprising:
an objective lens configured to focus a charged particle beam in an object plane;
a first condenser lens disposed in a beam path of the charged particle beam upstream of the objective lens;
a deflector disposed in the beam path between the first condenser lens and the objective lens, the deflector configured to change an angle of incidence of the charged particle beam in an object plane;
a second condenser lens disposed in the beam path between the deflector and the objective lens; and
an aberration corrector disposed in the beam path between the deflector and the objective lens, the aberration corrector configured to compensate aberrations introduced by the objective lens,
wherein:
the aberration corrector is configured to not compensate aberrations introduced by the first condenser lens;
the aberration corrector is configured to correct aberrations introduced by the second condenser lens; and
the system is a charged particle beam system.

2. The system according to claim 1, further comprising a beam scanner disposed in the beam path between the aberration corrector and the object plane, wherein the beam scanner is configured to scan a location of incidence of the charged particle beam across the object plane.

3. The system according to claim 2, wherein the aberration corrector comprises a plurality of multipole lens elements.

4. The system according to claim 2, wherein the aberration corrector comprises a mirror configured to reflect the charged particle beam.

5. The system according to claim 2, further comprising a charged particle beam source, wherein the first condenser lens is disposed in the beam path between the objective lens and the charged particle beam source.

6. The system according to claim 1, wherein the aberration corrector comprises a plurality of multipole lens elements.

7. The system according to claim 1, wherein the aberration corrector comprises a mirror configured to reflect the charged particle beam.

8. The system according to claim 1, further comprising a charged particle beam source, wherein the first condenser lens is disposed in the beam path between the objective lens and the charged particle beam source.

9. A method, comprising:
condensing a charged particle beam while introducing first aberrations into the charged particle beam to provide a first condensed charged particle beam;
deflecting the condensed charged particle beam to provide a deflected charged particle beam;
condensing the deflected charged particle beam while introducing second aberrations on the beam;
focusing the deflected charged particle beam on a specimen while introducing third aberrations into the deflected charged particle beam; and
compensating the second and third aberrations while leaving the first aberrations uncompensated to provide a compensated charged particle beam.

10. The method according to claim 9, further comprising scanning a location of incidence of the compensated charged particle beam across the specimen.

11. The method according to claim 9, further comprising using a charged particle source to provide the charged particle beam.

12. The method according to claim 9, comprising using an aberration corrector to compensate the second and third aberrations, wherein the aberration corrector comprises a plurality of multipole lens elements.

13. The method according to claim 9, comprising using an aberration corrector to compensate the second and third aberrations, wherein the aberration corrector comprises a mirror configured to reflect the charged particle beam.

14. A system, comprising:
an objective lens configured to focus a charged particle beam in an object plane;
a deflector disposed in a beam path of the charged particle beam upstream of the objective lens;
a first condenser lens disposed in a beam path of the charged particle beam system upstream of the deflector;
a second condenser lens disposed in the beam path of the charged particle beam downstream of the deflector; and an aberration corrector disposed in the beam path between the deflector and the objective lens, wherein the aberration corrector is configured to compensate aberrations introduced by components located in the beam path downstream of the deflector without compensating aberrations introduced by components located in the beam path upstream of the deflector, and the system is a charged particle beam system.

15. The system according to claim 14, further comprising a charged particle beam source, wherein the deflector is disposed in the beam path between the objective lens and the charged particle beam source.

16. The system according to claim 14, wherein the aberration corrector comprises a plurality of multipole lens elements.

17. The system according to claim 14, wherein the aberration corrector comprises a mirror configured to reflect the charged particle beam.

18. The system according to claim 14, further comprising a charged particle beam source upstream, wherein the first condenser lens disposed in the beam path between the objective lens and the charged particle beam source.

* * * * *